United States Patent
Matsui (10) Patent No.: US 7,795,713 B2
(45) Date of Patent: Sep. 14, 2010

(54) SEMICONDUCTOR DEVICE AND METHOD FOR PRODUCING THE SAME

(75) Inventor: Satoshi Matsui, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 12/033,917

(22) Filed: Feb. 20, 2008

(65) Prior Publication Data
US 2008/0197491 A1 Aug. 21, 2008

(30) Foreign Application Priority Data
Feb. 20, 2007 (JP) ............................. 2007-038868

(51) Int. Cl.
H01L 23/50 (2006.01)
H01L 21/58 (2006.01)
(52) U.S. Cl. ................... 257/678; 257/737; 257/773; 257/E21.505; 257/E23.079; 438/109
(58) Field of Classification Search .................. 257/678
See application file for complete search history.

(56) References Cited

U.S. PATENT DOCUMENTS 7,435,627 B2 * 10/2008 Horton et al. ............... 438/130

FOREIGN PATENT DOCUMENTS

JP 06-029456 A 2/1994

OTHER PUBLICATIONS

Tomonaga Kobayashi et al., "The electrical transmmision characteristics of the through type electrode formed on silicon", MES2004, Seiko Epson Co., Ltd., Production Engineering & Development Dept., pp. 113-116.

* cited by examiner

Primary Examiner—Zandra Smith
Assistant Examiner—Lawrence Tynes, Jr.
(74) Attorney, Agent, or Firm—Young & Thompson (57) ABSTRACT

The semiconductor device includes a silicon interposer made of a semiconductor and a first semiconductor chip mounted on one surface of the silicon interposer. The semiconductor device is provided with a through electrode penetrating the silicon interposer and having a side surface insulated from the silicon interposer; and a wiring connecting one end of the through electrode and the silicon interposer. The through electrode is connected to a power supply wiring or a GND wiring provided on the first semiconductor chip.

15 Claims, 6 Drawing Sheets

SEMICONDUCTOR DEVICE AND METHOD FOR PRODUCING THE SAME

BACKGROUND OF THE INVENTION

1. Field of the Invention

The present invention relates to a semiconductor device and a method for producing the same, and more particularly to a semiconductor device including an interposer and a method for producing the semiconductor device.

2. Description of the Related Art

In recent years, semiconductor devices in a package have been densified, and, as a result, a chip mounting area has been continuously reduced. In the course of reaching such an achievement, a multi chip module (MCM) which is a package having multiple chips packed therein has been developed. In order to further increase the density in the MCM, a three-dimensional package in which semiconductor chips (dies) are stacked by providing a through electrode penetrating the semiconductor chips is now being developed.

An organic substrate having a through hole is usually used as a package substrate on which semiconductors are mounted in an MCM. Alternatively, in place of the organic substrate, a silicon substrate having a through electrode can also be used. The silicon substrate can be produced relatively easily in a silicon device production line, and can be processed with high accuracy because the production method of the silicon substrate is the same as that of a device chip. At present, a technique for forming a through electrode through a silicon substrate is relatively difficult to be performed. Accordingly, a silicon substrate has not so far been put into practical use as a package substrate for the MCM.

Furthermore, in order to use a silicon substrate as a package substrate in an MCM, the silicon substrate has to be able to be reliably mounted with devices included in the MCM.

One of breakdown modes that reduce the packaging reliability is electrostatic discharge (ESD) damage. The ESD damage is a phenomenon in which the insulating function of a device is destroyed due to defects in an insulating film in the device. Here, the defects are formed when electric charges accumulated in a chip passes through the insulating film. For example, in a complementary metal oxide semiconductor (CMOS) device, the ESD damage is prone to be caused because a gate insulating film has a low breakdown voltage. Accordingly, an MCM including such a device should have a configuration in which the ESD damage is not caused during the assembly process or the use of the MCM.

A conductor having a larger outer surface area accumulates a larger quantity of static electricity, when a module is charged. This is because, since the conductor builds a capacitor with the outside, the accumulation amount of electric charges is in proportion to the surface area of the conductor. When a silicon substrate is employed in a module, the silicon substrate is a conductor having the largest conductor therein. As a result, the substrate itself can be the largest current source in the module.

However If a silicon substrate has no through electrode, a thick insulating film can be provided to the entire surface of the substrate. The provision of such a film enables the silicon substrate to be separated from a wiring with very high dielectric strength. As a result, the silicon substrate does not cause any ESD damage. In contrast, if a silicon substrate has a through electrode, it is difficult to form a thick insulating film on the wall on which the through electrode is provided. Consequently, the distance between the substrate and a conductor pattern is short. Therefore, the flow of a high potential of the substrate due to static electricity may break the insulation between the substrate and the wiring. This phenomenon is caused by the package substrate made of a semiconductor.

A technology related to a wiring substrate using a silicon substrate described in Japanese Unexamined Patent Application Publication No. Hei 6-29456 (Patent Document 1) has been available. This document discloses a semiconductor wiring substrate provided with a through electrode for connecting multiple chips, and for collectively wiring external connection terminals. The semiconductor wiring substrate is mounted to cover from above multiple chips placed flat with the element-formed surface facing upward. The semiconductor wiring substrate connects the multiple chips to each other and includes a bonding pad for connection of the substrate with an external terminal. The bonding pad is formed on the top surface of the wiring substrate. According to the above document, an electrostatic protection circuit which is formed inside a chip in a conventional technology is formed on the semiconductor wiring substrate between the bonding pad and the connection terminal connecting the bonding pad to the chip.

In "The electrical transmission characteristics of the through electrode formed on silicon" by Tomonaga Kobayashi and four others, *MES*2004 (pp. 113-116), October, 2004, which reports to a study in a different technical field, electrical characteristics of a through electrode formed on a silicon substrate are evaluated. In the evaluation described in this document, a through electrode is mounted on a certain one of surfaces of the silicon substrate, and an impurity diffusion layer is formed on the opposite surface of the silicon substrate from the certain surface. By connecting the through electrode and the impurity diffusion layer electrically, the potential of the impurity diffusion layer is set to be a constant potential such as a GND potential and a power supply potential. This document also reports results from experiments and simulation in which the electrical transmission characteristics of the through electrode are examined by varying the potential of the impurity diffusion layer.

A conventional package substrate is usually an organic substrate as described above. For this reason, no evaluation has been made as to an influence of a conductive package substrate on the reliability in packaging. Against this background, in order to use a silicon substrate as a package substrate, it is now necessary to develop a configuration including appropriate means for dissipating a surge of static electricity caused by ESD. This is a critical problem to be solved in designing and producing an MCM.

To solve such a problem, it may be considered to provide a protective element on a silicon substrate as described in Patent Document 1. In such a configuration, a protective circuit utilizing a P-N junction is mounted as a protective element, as in the device. Since the protective circuit is located on the silicon substrate, it is necessary to perform a selective ion injection process multiple times in the production.

However, when a silicon substrate is employed as a package substrate, it is desirable that no formation of P-N junction be involved for the purposes of making the production process easier and of avoiding an increase in cost. Hence, it is required to develop a technology for solving the ESD problem with a configuration including no diode or transistor.

SUMMARY OF THE INVENTION

The present invention provides a semiconductor device which includes an interposer made of a semiconductor and a semiconductor chip mounted on a certain one of surfaces of the interposer. The semiconductor device also includes a through electrode which is insulated from the interposer on the side surface thereof upon penetrating the interposer, and a connection conductor which connects one end of the through electrode to the interposer. The through electrode in the semiconductor device is connected to a power supply wiring or a GND wiring provided on the first semiconductor chip.

The present invention also provides a method for producing a semiconductor device. The semiconductor production method includes the following steps: a step for preparing an interposer made of a semiconductor; a step for preparing a semiconductor chip provided with a GND wiring or a power supply wiring; and a step for mounting the semiconductor chip on one surface of the interposer. The step for preparing an interposer includes the following steps: a step for forming a through electrode penetrating the interposer in a predetermined position in the interposer; a step for forming a connection conductor for connecting the through electrode and the interposer; and a step for forming a conductive member for connecting the through electrode and the semiconductor chip. The step for mounting the semiconductor chip includes a step for connecting the conductive member and the GND wiring or the power supply wiring.

In the present invention, an interposer made of a semiconductor is connected to a through electrode which penetrates the interposer, while the through electrode is connected to a power supply wiring or a GND wiring provided in the semiconductor chip. Accordingly, electric charges accumulated in the interposer can be released out of the device via the power supply wiring or the GND wiring. By releasing electric charges accumulated in the interposer via the power supply wiring or the GND wiring, it is possible to prevent the electric charges from flowing into a part of the insulating film having a low voltage resistance from, for example, an input stage of the semiconductor chip. Therefore, occurrence of ESD damage can be restrained. As a result, the reliability of the semiconductor device can be increased.

In the present invention, it is possible to restrain occurrence of ESD damage without having an additional step for forming an electrostatic protection circuit using a P-N junction in an interposer. Hence, ESD damage can be restrained more easily and simply in the present invention than in the method described in Patent Document 1.

In the present specification, an interposer is a plate-like member which is used for electric connection of semiconductor devices stacked to each other in a stacked semiconductor device. The interposer has a silicon substrate made of a semiconductor and a wiring formed on one surface of the silicon substrate. The interposer further includes a through electrode penetrating the interposer. The through electrode is electrically connected to a conductive member of a first semiconductor chip mounted facing one surface of the interposer. For further simplification of the production process for the interposer, it is preferable that the configuration of the interposer include no active element, such as a transistor. Furthermore, the configuration of the interposer may include an element other than the active element, for example, a passive component, such as a wiring, a capacitor, an inductor, and an antenna, and may include no passive component.

In the present invention, in order to achieve the condition where the through electrode is insulated from the interposer, it is sufficient to block the conduction between the side surface of the through electrode and the side surface of the through hole of the interposer only to an extent that no practical problem arises. For example, in addition to a configuration in which an insulation material is provided on the entire surface of the side surface of the through electrode, the present invention may have other configurations, such as a configuration in which an insulation material is provided on a partial area of the side surface, and a configuration in which there is a gap between the through electrode and the through hole.

Incidentally, any combination of these configurations and the embodiments, which are described as a method, a device, or the like in the present invention, being expressed in other form, such as a method, a device, and the like, are also valid as an embodiment of the present invention.

As described above, the present invention effectively inhibits occurrence of ESD damage in a multi-chip module by having an interposer connected to one end of the through electrode penetrating to the interposer upon having the through electrode connected to a power supply wiring or a GND wiring mounted on a first semiconductor chip.

DETAILED DESCRIPTION OF THE PREFERRED EMBODIMENTS

Preferred embodiments of the present invention will be described below with reference to drawings. In all drawings, the same components are denoted by the same reference numerals, and the descriptions thereof are omitted.

In the following embodiments, a configuration in which a silicon substrate constituting an interposer is connected to a GND wiring is mainly exemplified. However, the silicon substrate constituting an interposer may be connected to a Vdd wiring.

Embodiment 1

Figure 1A:
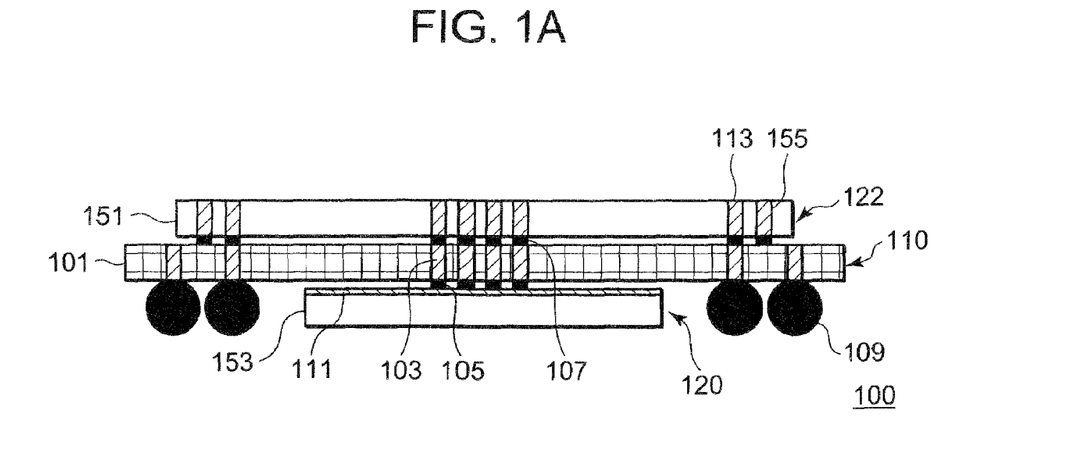
FIGS. 1A and 1B are drawings showing a configuration of a semiconductor device of Embodiment 1.
Figure 1B:
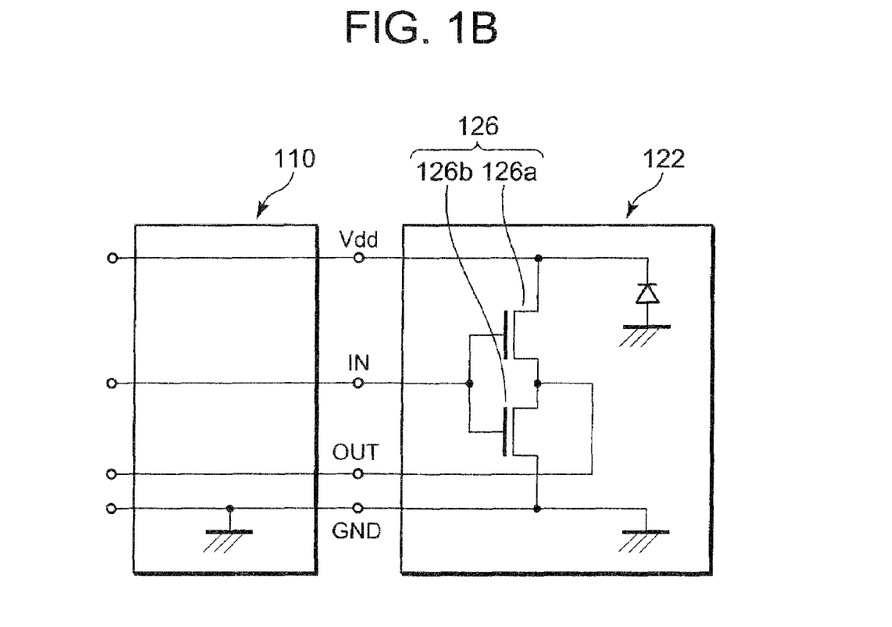
Figure 3:
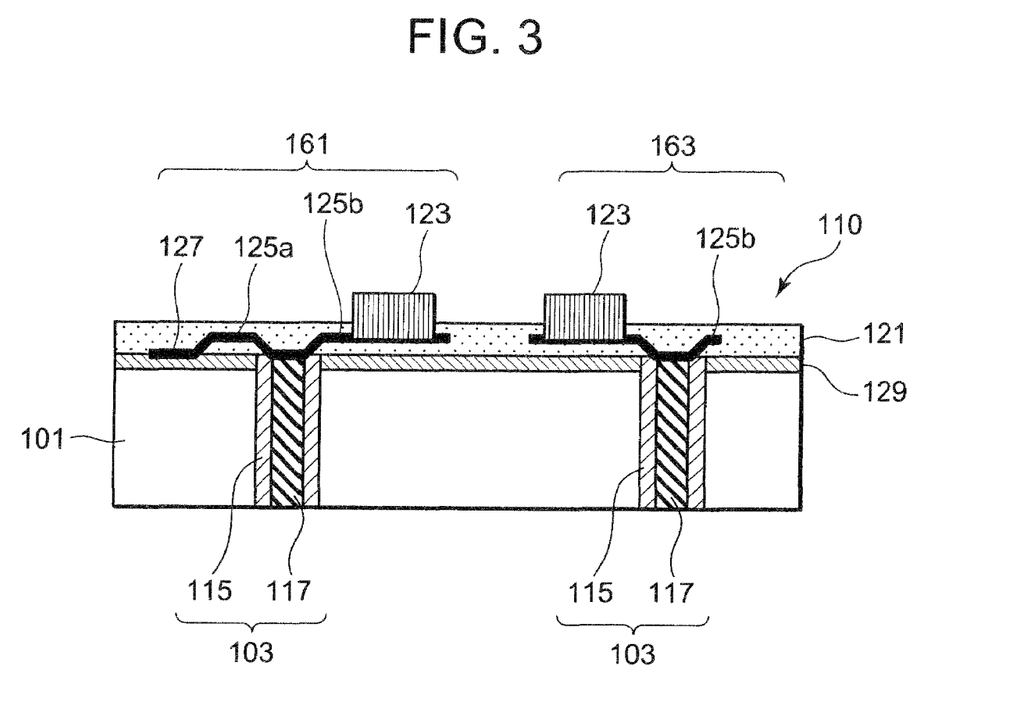
FIG. 3 is a cross-sectional view showing the configuration of an interposer of the semiconductor device in Embodiment 1.

FIGS. 1A and 1B are a drawing showing the configuration of the semiconductor device in the present embodiment. FIG. 1A is a cross-sectional view showing the configuration of a semiconductor device 100. FIG. 1B is a drawing showing the connection between a silicon interposer 110 and a first semiconductor chip 122 in the semiconductor device 100. FIG. 3 is a cross-sectional view showing the configuration of the silicon interposer 110 in more detail.

The semiconductor device 100, which is a multi-chip module provided by packaging multiple semiconductor devices in one package, has a stack structure, as shown in FIG. 1A, in which a second semiconductor chip 120, the silicon interposer 110, and the first semiconductor chip 122 are stacked in this order from the bottom. The silicon interposer 110 is composed of a silicon substrate 101 made of a semiconductor (silicon). In the configuration of the semiconductor device 100, device chips are mounted on the top surface and the bottom surface of the silicon interposer 110 serving as a package substrate.

As shown in FIG. 1B, Vdd, GND, IN, and OUT signals are connected to the first semiconductor chip 122 via the silicon interposer 110. Incidentally, the IN signal line is connected to an internal circuit (not shown) via a CMOS transistor 126 composed of a P channel MOS transistor 126a and a N channel MOS transistor 126b. The second semiconductor chip 120 is mounted on the surface of the silicon interposer 110 opposite to the surface having the first semiconductor chip provided thereon. Four kinds of wirings including Vdd, GND, IN and OUT wirings of the second semiconductor chip are each connected to a corresponding wiring on the silicon interposer 110.

The GND line 161 (FIG. 3) is provided with a contact (connection region 127 in FIG. 3) which is connected in ohmic contact to the silicon substrate 101 via an impurity diffusion layer 129, which will be described below. The contact is connected to a through electrode 117 by means of a metal wiring (wiring 125a in FIG. 3). Therefore, the potential of the silicon substrate 101 constituting the silicon interposer 110 is the same as that of a GND terminal. The silicon substrate 101 is connected to the substrate of the first semiconductor chip 122 or the second semiconductor chip 120 via the GND line, but not via the gate insulation film of a MOS transistor provided in the first semiconductor chip 122 or the second semiconductor chip 120 along the path.

On the other hand, each of the IN, OUT, and Vdd lines 163 is not provided with the above described contact (see FIG. 3).

As shown in FIGS. 3 and 1A, the silicon interposer 110 is provided with a through electrode structure 103 including the through electrode 117, the impurity diffusion layer 129, an interlayer insulation film 121, a connection conductor (wiring 125), a conductive member (bump electrode 123), a bump electrode 109, and the like.

One silicon interposer 110 is provided with multiple through electrode structures 103. The through electrode structure 103 is composed of the through electrode 117 and a side wall insulation film 115. The through electrode 117 is buried in a through hole penetrating the silicon substrate 101, and insulated from the silicon substrate 101 on the side wall of the through hole by means of the side wall insulation film 115 covering the side wall of the through hole.

In FIG. 3, a configuration in which the entire side surface of the through electrode 117 is covered with the side wall insulation film 115 is exemplified. However, the side wall insulation film 115 is not necessary to be provided on the entire side surface of the through electrode 117 as long as the conduction between the side surface of the through electrode 117 and the side wall of the through hole is blocked to an extent that no practical problem arises.

The impurity diffusion layer 129 is a region in which an impurity of the same conductivity type (for example, p-type) as that of the silicon substrate 101 constituting the silicon interposer 110 is injected, and is formed on the entire area of one surface of the silicon substrate 101 in the vicinity of the surface thereof. The potential of the impurity diffusion layer 129 is at, for example, a GND potential.

In the region of the GND line 161, the wiring 125a is formed above the impurity diffusion layer formation surface of the silicon substrate 101. The wiring 125a is a conductor pattern which connects the impurity diffusion layer 129 of the silicon substrate 101 and one end of the through electrode 117. The wiring 125b connecting the bump electrode 123 and the through electrode 117 is further provided above the impurity diffusion layer formation surface of the silicon substrate 101. The wirings 125a and 125b on the silicon interposer 110 are provided at constant intervals, and thus forming a microstrip construction on the silicon substrate 101. Accordingly, the wirings 125a and 125b have constant characteristic impedances.

In this case, while one end of the wiring 125a is connected to the end part, on the impurity diffusion layer side, of the through electrode 117, the other end of the wiring 125a serves as a connection region 127 in contact with the impurity diffusion layer 129. In the connection region 127, the wiring 125a is connected in ohmic contact to the impurity diffusion layer 129 of the silicon substrate 101. A metal silicide layer may be provided on the surface of the impurity diffusion layer 129 in the connection region 127. In such a formation, a better ohmic connection having a decreased resistance between the wiring 125a and the impurity diffusion layer 129 can be achieved.

Meanwhile, the other wiring 125b provided at the end of the same through electrode 117 is connected to the bump electrode 123. In each of the areas of IN, OUT, and Vdd line 163, the through electrode 117 is connected to the bump electrode 123 via the wiring 125b, but is not provided with the connection region 127 for forming the connection with the impurity diffusion layer 129 of the silicon substrate 101. In the area of IN, OUT, or Vdd line 163, the wiring 125b on the silicon interposer 110 is also provided at constant intervals, and thus forming a microstrip structure on the silicon substrate 101. Accordingly, the wiring 125b has constant characteristic impedance.

The bump electrode 123 of the GND line 161 is connected to the GND (ground) wiring provided in the first semiconductor chip 122 mounted on one surface (impurity diffusion layer formation surface) of the silicon interposer. The bump electrodes 123 of the IN, OUT, and Vdd line 163 is further connected to an input signal line (IN), an output signal line (OUT), and a power supply wiring (Vdd), respectively, provided in the first semiconductor chip 122 mounted on one surface (impurity diffusion layer formation surface) of the silicon interposer.

In the present embodiment, the wiring 125a connecting the through electrode 117 and the impurity diffusion layer 129 and the wiring 125b connecting the through electrode 117 and the GND wiring of the first semiconductor chip 122 are both provided on the same surface of the silicon interposer 110. A connecting portion between the silicon substrate 101 and the wiring 125a (subcontact; connection region 127) is formed on the opposite side of the path connecting the GND terminal and the through electrode 117.

The wiring 125 is covered with the interlayer insulation film 121. The material of the interlayer insulation film 121 is, for example, polyimide. The bump electrode 123 which is located in an opening formed in the interlayer insulation film 121 is exposed from the interlayer insulation film 121.

FIG. 3 only shows the wirings, including the GND line 161 (wiring having a subcontact) and other line, more specifically, IN, OUT, or Vdd line 163 (wiring having no subcontact).

The bump electrode 109 shown in FIG. 1 is an external connecting terminal which can be used when the semiconductor device 100 is further mounted on the other substrate.

The first semiconductor chip 122 is provided with a silicon substrate 151 on an element forming surface 113, and on the other surface of the first semiconductor chip 112 faces the silicon interposer 110. The first semiconductor chip 122 has multiple through electrodes 155 penetrating the silicon substrate 151, an IN wiring, an OUT wiring, a GND wiring, and a Vdd wiring. A predetermined element including a CMOS transistor 126 including a P-channel MOS transistor 126a and an N-channel MOS transistor 126b is formed on the element forming surface 113 of the first semiconductor chip 122. Some of the through electrodes 155 are connected to some of through electrodes 117 via a bump electrode 107.

The IN wiring is connected to the gate electrode of the CMOS transistor 126. The OUT wiring is connected to the drain electrode of the CMOS transistor 126.

The second semiconductor chip 120 is provided with a silicon substrate 153 on an element forming surface 111, and the element forming surface 111 which faces the silicon interposer 110 is provided with a predetermined element. The through electrode 117 is connected to a conductive member (not shown) provided on the element forming surface 111 via the bump electrode 105.

A method for producing the semiconductor device 100 will be described in the following section.

The production method in the present embodiment includes the following steps: step 11 for preparing an interposer (silicon interposer 110) made of a semiconductor; step 12 for preparing the first semiconductor chip 122 provided with the GND wiring or a power supply (Vdd) wiring; step 13 for mounting the first semiconductor chip 122 on one surface of the silicon interposer 110; and step 14 for mounting the second semiconductor chip 120 on the other surface of the silicon interposer 110.

Figure 9A:
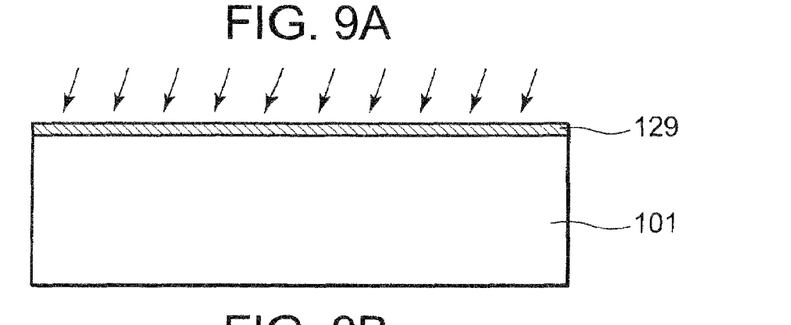
FIGS. 9A to 9D are cross-sectional views showing the production process for the interposer of the semiconductor device in Embodiment 1.
Figure 9B:
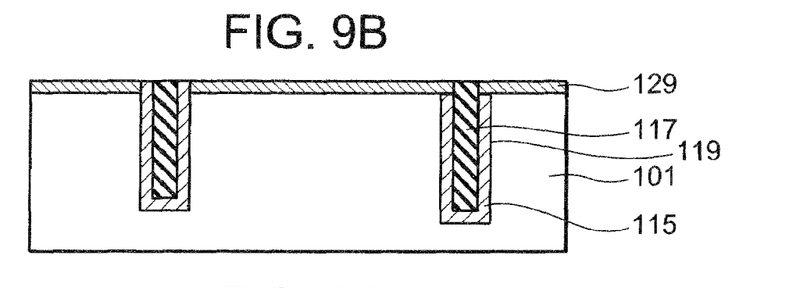

With reference to FIGS. 9A to 9D, the step 11 for preparing the silicon interposer 110 will be further described in detail below. FIGS. 9A to 9B are a cross-sectional view showing a process for producing the silicon interposer 110.

Firstly, the silicon substrate 101 to be used as a package substrate is prepared to be available for ohmic connection. If the substrate has a low resistance, no treatment is required. For the substrate having a high resistance, ion injection or ion solid layer diffusion is carried out to form an impurity diffusion layer having a low resistance on the surface of the substrate. In this embodiment, as shown in FIG. 9A, an ion injection of an impurity having the same conductivity type as that of the silicon substrate 101 is performed to form the impurity diffusion layer 129 in the vicinity of one surface of the silicon substrate 101. An impurity to be used in the ion injection to the silicon substrate 101 may be, for example, As and P.

A through electrode penetrating the silicon substrate 101 is subsequently formed in a predetermined position of the silicon substrate 101.

As shown in FIG. 9B, multiple concave portions 119 are formed by selectively removing a predetermined position on the silicon substrate surface on which the impurity diffusion layer 129 is formed. Subsequently, after an insulation film serving as a side wall insulation film 115 is formed on the silicon substrate 101 having the recess portions 119 formed thereon, a conductive film serving as the through electrode 117 is formed in such a way that the recess portion 119 is filled. The insulation film and the conductive film formed outside of the concave portion 119 are removed to cause the surface of the impurity diffusion layer 129 to be exposed.

Figure 9C:
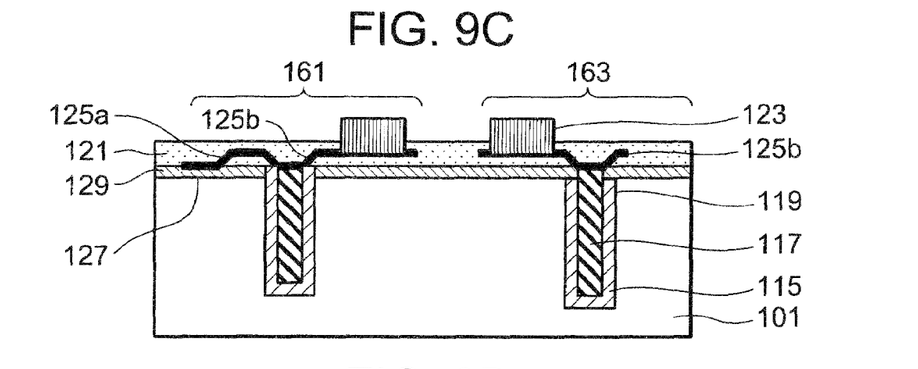
Figure 9D:
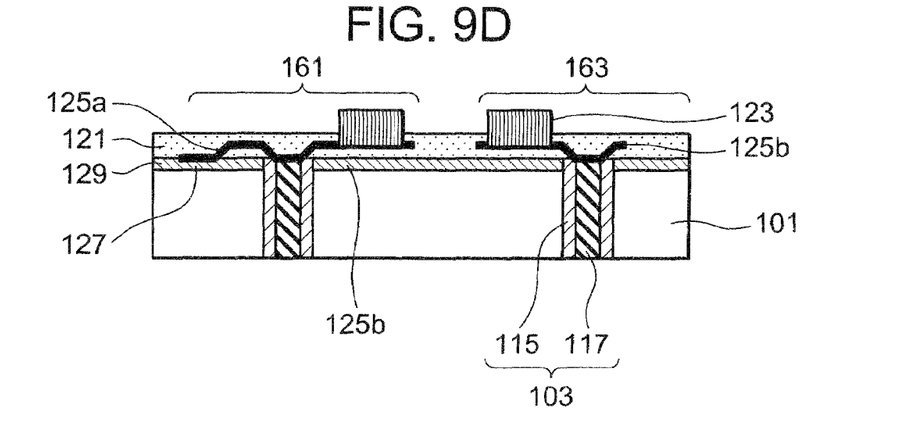

Next, as shown in FIG. 9C, by utilizing a known rewiring process, the wirings 125a and 125b in a predetermined pattern and the interlayer insulation film 121 are formed on the surface having the impurity diffusion layer 129 formed thereon. These wirings have, for example, Ti which forms silicide at low temperatures in the undermost layer. As a result, an ohmic contact having a low resistance can be obtained in the connection between the wiring and the impurity diffusion layer. Alternatively, an ohmic contact having a low resistance can also be obtained by forming a metal silicide layer on the surface of the impurity diffusion layer in advance. In a wiring formation step, the through electrode 117 of the GND line 161 and the silicon substrate 101 are connected to each other for conduction. To be more specific, at least one wiring 125a is configured to connect one end of the through electrode 117 of the GND wiring 161 with the impurity diffusion layer 129. Incidentally, the through electrode 117 of IN, OUT, or Vdd line 163 is not electrically connected to the silicon substrate 101. Another wiring 125b not connected to the impurity diffusion layer 129 is formed in the through electrode 117.

The interlayer insulation film 121 is formed, for example, by providing photosensitive polyimide in spin coating.

Then, the interlayer insulation film 121 is selectively removed by lithography and etching to expose a predetermined position of the wiring 125b not being in contact with the impurity diffusion layer 129. The bump electrode 123 to be connected to the exposed wiring 125b is formed by a plating method. The bump electrode 123 is a conductive member for connecting the through electrode 117 and the first semiconductor chip 122.

Next, as shown in FIG. 9B, the thickness of the silicon substrate 101 is reduced by grinding the back surface of the silicon substrate to expose the end sides of the side wall insulation film 115 and the through electrode 117. In the above steps, the silicon interposer 110 is prepared.

Then, in an MCM assembly, the device chips are stacked using the silicon interposer 110 as a base. To be more specific, in steps 13 and 14, a semiconductor chip and the silicon interposer 110 are perpendicularly stacked, and then electrically connected.

In this step, the through electrode 117 of the GND line 161 connected to the impurity diffusion layer 129 of the silicon substrate 101 is connected to the GND terminal of the first semiconductor chip 122 via the wiring 125b and the bump electrode 123. In other words, in the step 13 for mounting the first semiconductor chip 122, the bump electrode 123 of the GND line 161 provided on the silicon interposer 110 and the GND line formed in the first semiconductor chip 122 are connected.

Furthermore, after the step, a semiconductor chip may also be stacked in the second or later layer. In this case, ESD damage on the chip in the second or later layer can be more reliably restrained by having the semiconductor chip in the second or later layer to share the GND with the first semiconductor chip 122. Furthermore, upon completing stacking of the device chips, the entire device may also be mold-sealed by means of a resin.

In the above description, the device described has a configuration in which the GND line of the silicon interposer 110 is electrically connected to the silicon substrate 101, and the GND line is connected to the GND wiring formed in the first semiconductor chip 122. Alternatively, the device may have a construction in which the Vdd line of the silicon interposer 110 is electrically connected to the silicon substrate 101 and the Vdd line is connected to the Vdd wiring formed in the first semiconductor chip 122.

The effects of the present embodiment will be described in the following section.

In the present embodiment, the wiring 125b connected to the GND wiring or Vdd wiring of the first semiconductor chip 122 via the bump electrode 123 and the wiring 125a connected to the impurity diffusion layer 129 are provided in the place of the wiring 125 connected to one through electrode 117. In such a configuration: (i) a path through which a surge due to accumulation of electric charges in the silicon substrate 101 is dissipated to the outside of the substrate is formed by connecting the silicon substrate 101 and the silicon interposer 110 using a contact (connection region 127) provided to the wiring 125 thereon; and (ii) no electric charge flows in a gate insulation film of the device input stage upon using a wiring serving as the path for a power supply or a GND.

As described above, in the case of employing the silicon interposer 110 in a multi-chip module, it is possible to prevent ESD damage due to the silicon substrate 101 to improve the reliability of an MCM by connecting the potential of the silicon substrate 101 to the GND wiring or the Vdd wiring without providing an active ESD protective element on the silicon interposer 110 having the through electrode 117.

Figure 2A:
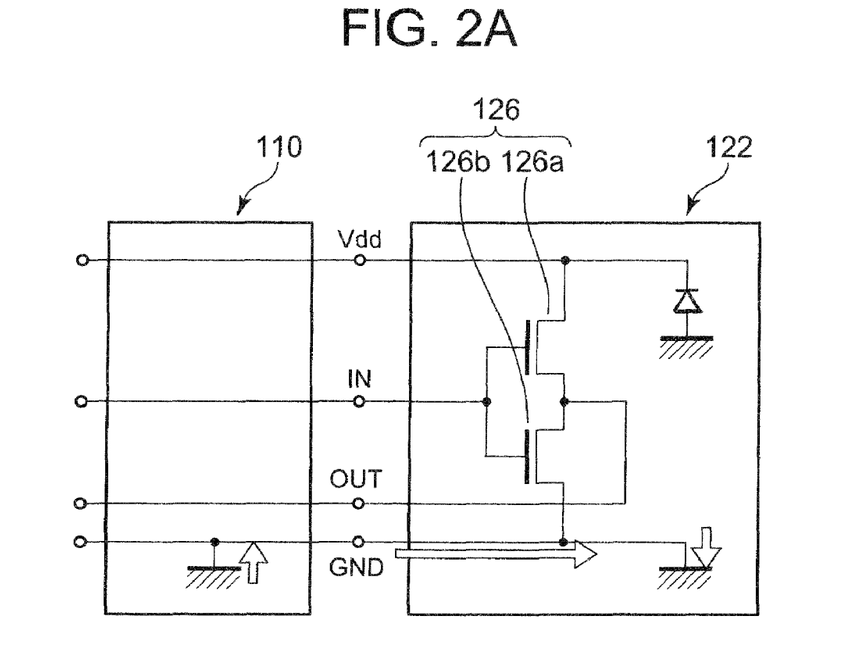
FIGS. 2A and 2B are drawings showing the configuration of the semiconductor device of Embodiment 1.
Figure 2B:
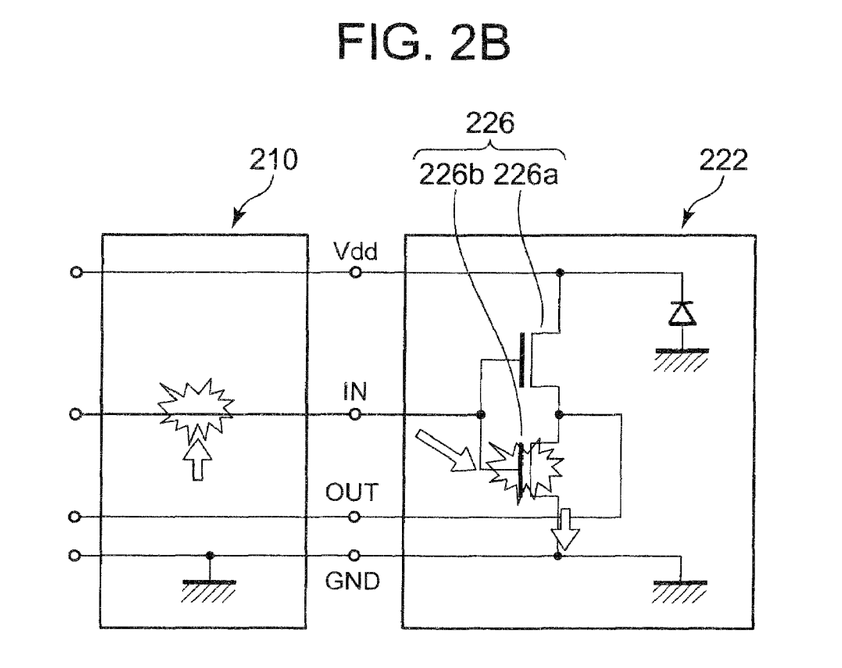

This point will be further described specifically by referring to FIGS. 2A and 2B.

FIG. 2A corresponds to the configuration of FIG. 1B. In FIG. 2A, the silicon interposer 110 is provided with a contact, and grounded to the substrate of the first semiconductor chip 122. In FIG. 2B, on the other hand, a silicon interposer 210 is not provided with a contact, which is provided in FIG. 2A. As a result, electric charges accumulated in the silicon interposer 210 flow in a gate insulation film of an N-channel MOS transistor 226b of a first semiconductor chip 222 via an IN terminal, resulting in destruction of insulation. In FIGS. 2A and 2B, the arrows indicate a route of electric charge flow, and star symbols indicate a point of insulation destruction occurred.

Next, cases in which a high voltage is applied to the interposer, such as cases in which two chips are connected to each other in assembling, and where the interposer is exposed to static electricity, will be examined. When a difference in potential is present between two chips, a surge current flows to eliminate the potential difference. The amplitude of the current is largest between substrates constituting a large-sized capacitor. When a current flows from an interposer to a device, it is highly possible that destruction of the gate insulation film occurs in the configuration shown in FIG. 2B, which is different from the configuration of the present embodiment.

When the substrate of the interposer 210 is not connected to a conductor as in the configuration shown in FIG. 2B, a surge current destroys a most fragile insulation film of any line, and then flows in a wiring. In the case where the most fragile part is the input terminal indicated by the star symbol in FIG. 2B, a current, which is supposed to flow into a substrate, directly flows into a gate insulation film indicated by a star symbol on the first semiconductor chip 222, destroys the insulation, and then flows into the substrate. When a current flows through an insulation film, deterioration, such as a reduced voltage resistance of the insulation film itself, and destruction of the insulation, occurs as a function of the amount of electric charges passing through, resulting in device failure. The same event occurs when a substrate is wired to an input signal line via a contact. The highest current among the currents generated for eliminating a potential difference flows through a gate insulation film, resulting in device failure.

On the other hand, in FIG. 2A, a conductor is directly wired to the interposer 110, and the wiring is connected to the GND of the first semiconductor chip 122. In this case, a majority of the currents flowing between two substrates flows from the GND terminal into the silicon substrate 151 of the first semiconductor chip 122; therefore, migrating in a path without going through a gate insulation film. Accordingly, even the maximum capacity of the current flowing through the gate insulation film is only as high as the capacity of the wiring connected to the gate. Consequently, the quantity of the passing electric charges, which is a factor involved in the deterioration of gate insulation film, is extremely small compared to in the case of having the configuration shown in FIG. 2B. Accordingly, damage to the gate insulation film can be minimized, the device would not be damaged even if a surge is applied to the substrate, and therefore the reliability of an MCM can be dramatically increased.

As shown in FIG. 3, the impurity diffusion layer 129 of the silicon substrate 101 is connected to the GND of the semiconductor chip through the through electrode 117 in the semiconductor device of the present embodiment. In such a configuration, as shown in FIG. 2A, the silicon substrate 101 constituting the interposer and the substrate 151 constituting the first semiconductor chip 122 are connected to each other without having no P-N junction in the connection upon using the GND terminal as a path for dissipating a surge. Accordingly, having no Schottky barrier, the path for dissipating a surge has a much smaller electric resistance; therefore, it is possible to increase the reliability by further minimizing the damage to the gate insulation film.

As described above, it is guaranteed that ESD discharge from the interposer 110 is not allowed to enter the input stage of the device without providing a protective element on the silicon interposer 110 in the present embodiment. Accordingly, it is possible to reduce a risk of the destruction of gate insulation film, and thereby possible to improve the reliability of the module.

For an interposer having no through electrode, it is also possible to employ a method in which destruction of insulation is prevented within an expected range of ESD by providing a very thick insulation film between the silicon substrate and the wiring.

On the other hand, the silicon interposer 110 of the present embodiment has the through electrode 117. In this case, there is a concern of occurrence of a surge flowing through the side wall insulation film 115 unless countermeasures against ESD destruction are implemented.

The side wall insulation film 115 cannot be thicker than, for example, several μm. Therefore, when the diameter of the through electrode 117 is approximately 10 μm, the side wall insulation film 115 cannot be thicker than, for example, 2 μm to 3 μm. For another reason, since the through electrode 117 has a narrow pitch, the pitch may not be able to be any narrower physically. Furthermore, a metal electrode is to be made thicker from the viewpoint of reducing the resistance of the through electrode 117; thus, it is impossible to provide a side wall insulation film 115 which is thicker than a certain thickness. For example, in the case where the through electrode 117 having a conductor diameter of 40 μm is provided at a pitch of 50 μm, the side wall insulation film 115 can be as thick as up to approximately 5 μm.

In such a configuration, it is difficult to perfectly prevent electric charges from flowing in by providing insulation with a resin film having a thickness of 5 μm or above, which can be provided in an interposer having no through electrode. In other words, the silicon interposer 110 provided with the through electrode 117 should be designed in consideration of the insulation between the silicon substrate 101 and the through electrode 117 being relatively weak. Otherwise, the reliability will be decreased.

For this reason, in the present embodiment, it is configured that electric charges flows from the silicon substrate 101 mainly via conductor wirings (wiring 125a and wiring 125b) to the GND wiring or Vdd wiring of the silicon substrate 153 or the silicon substrate 151. In this configuration, even in the case where the side wall insulation film 115 provided on the silicon substrate 101 and the through electrode 117 cannot be thickened, it is possible to prevent occurrence of a surge which may destroy the sidewall insulation film 115. Accordingly, the reliability can be increased.

A surge is generated not only during the use of the device but also during the production of an MCM, as well as the mounting thereof to a board. This issue is considered by taking the production of an MCM as an example. In some cases where a device is mounted on a silicon interposer as a base, a device chip is mounted on the substrate of a semiconductor chip located below being charged. For example, a semiconductor chip is electrostatically charged in a plasma cleaning process for washing the terminal performed immediately before a stacking process. If the electrostatically-charged chip is put together with the other chip before being discharged, a difference in potential is generated between two chips; therefore, ESD discharging occurs.

When an MCM is washed with a highly insulating washing liquid in a flux washing process and the like, electric charges are accumulated corresponding to the size of an area exposed to the outside due to static electricity in some cases. In such cases, having the same trend as described above, a largest amount of electric charges is accumulated in a substrate having the largest exposed area. In such a case, a difference in potential is generated between two chips, resulting in occurrence of ESD damage. Since an external connection terminal is not yet formed during the assembly process, a path for discharging electric charges to the outside of the module cannot be provided. In such a case, the electric charges are discharged so as to achieve a uniform potential within the module, or are discharged to the outside via the substrate. At this point, if the substrate is not connected to a different chip in the module in advance, electric charges flow into an unpredicted wiring upon destroying the most fragile portion of an insulation film. As a result, ESD damage of the device is caused.

Furthermore, in the case where the entire module is charged, ESD damage is also caused when electric charges are released through some external terminals into the environmental atmosphere.

Even in the case of a standard MOSFET (metal-oxide semiconductor field-effect transistor), which has a discharge path from the substrate to the external terminal, and therefore is capable of releasing electric charges without destroying the insulation film, discharge from the interposer occurs due to the destruction of any insulation film if no discharge path from the interposer is formed. As a result, a high voltage is rapidly applied to a certain position, resulting in occurrence of ESD damage.

In the configuration of the present embodiment, occurrence of such ESD damage caused by the reasons as described above can also be effectively restrained.

In Patent Document 1 described in Description of the Related Art, it is necessary to provide an element on a silicon substrate constituting an interposer having no switching function and therefore originally requiring no active element, resulting in an increased difficulty of production due to increased complexity of the production process. The present embodiment, on the other hand, does not involve such a complexity of the production process; therefore, it is possible to improve the reliability of the device easily and reliably. Accordingly, in the present embodiment, occurrence of ESD destruction can be prevented even without providing, for example, an element using a P-N junction to the silicon interposer 110.

In the semiconductor device 100, the impurity diffusion layer 129 is provided on the surface of the silicon substrate 101, and the wiring 125 and the silicon substrate 101 are connected to each other without involving a Schottky barrier. Therefore, it is possible to form a current path having a lower resistance which is capable of releasing a surge more easily. In addition, it is possible to control the substrate potential of the silicon interposer 110. As a result, the deterioration of transmission characteristics due to the fluctuation of the substrate potential can be prevented by means of impedance matching.

Incidentally, in the semiconductor device 100, a contact portion (subcontact portion), which is the connection region 127, is provided in a different conductive path other than the connection path between the through electrode 117 and the Vdd wiring or the GND wiring as shown in FIG. 3. However, the present invention is not limited to the case where the contact portion is provided in the different path other than the connection path as described above.

Figure 4:
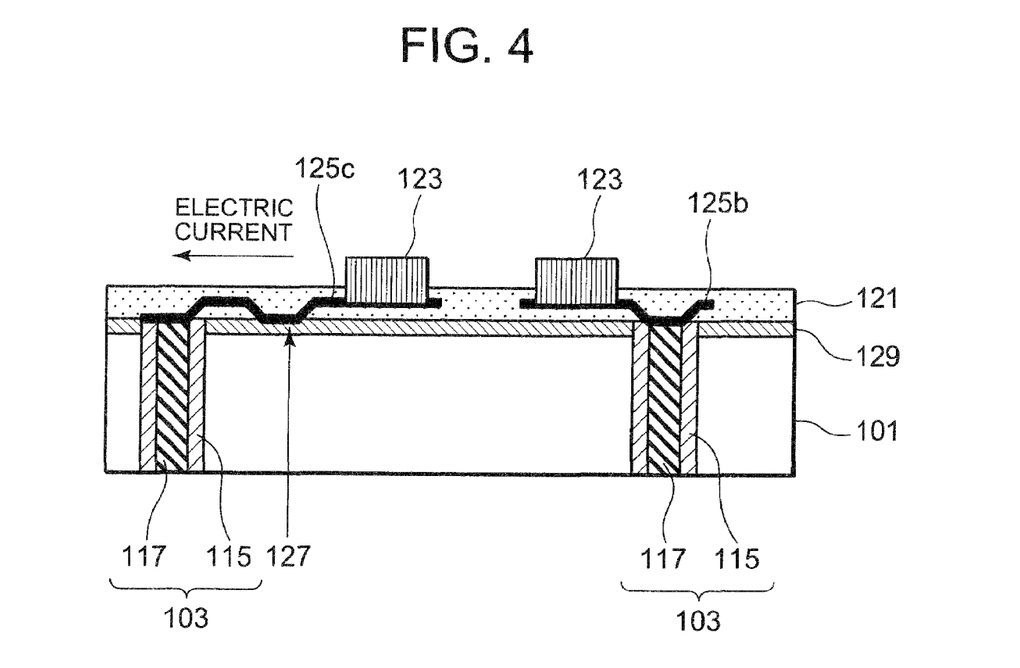
FIG. 4 is a cross-sectional view showing the configuration of the interposer of the semiconductor device in Embodiment 1.

FIG. 4 is a cross-sectional view showing a configuration in which a wiring 125c connecting the bump electrode 123 and the through electrode 117 is in contact with the impurity diffusion layer 129.

In FIG. 3, the connection region 127 is disposed distant from a steady current path. With this disposition, occurrence of metal electromigration in the contact area 127 when a current flows in the connection region 127 and occurrence of open failure between the wiring 125 and the silicon substrate 101 due to the electromigration are restrained, and therefore resulting in the configuration shown in FIG. 3 capable of establishing a connection between the silicon substrate 101 and the wiring 125 more reliably as compared to the configuration shown in FIG. 4. Accordingly, the configuration shown in FIG. 3 is more preferable than the configuration shown in FIG. 4.

FIG. 1 shows a configuration in which the semiconductor device 100 including the silicon interposer 110 and two semiconductor chips. However, the number of semiconductor chips to be stacked is not especially limited.

Figure 7:
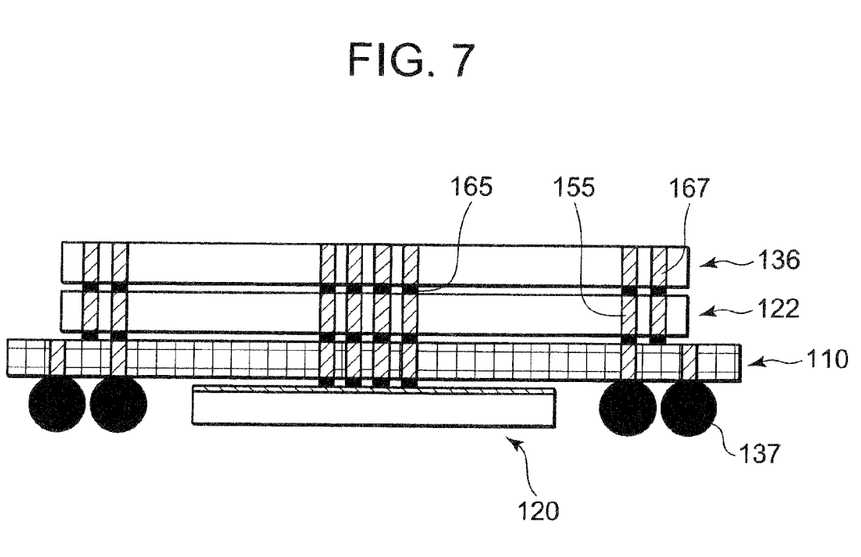
FIG. 7 is a cross-sectional view showing the configuration of a modification of the semiconductor device in Embodiment 1.

FIG. 7 is a cross-sectional view showing a different construction of the MCM of the present embodiment. The semiconductor device shown in FIG. 7 is a MCM multi stage type of a CoC (chip on chip) type. The basic configuration of the device shown in FIG. 7 is the same as the configuration of the device shown in FIG. 1. The difference between the configurations of the devices shown in FIGS. 1 and 7 is that the device shown in FIG. 7 has a third semiconductor chip 136 electrically connected to the first semiconductor chip 122 via the bump electrode 165 being stacked on the first semiconductor chip 122. The third semiconductor chip 136 is also provided with a through electrode 167.

Such a configuration also provides the same effect as that of the device shown in FIG. 1.

In the following embodiments, semiconductor devices having a different MCM stack configuration will be described upon focusing on a difference between the semiconductor device to be described below and the device described in Embodiment 1.

Embodiment 2

Figure 5:
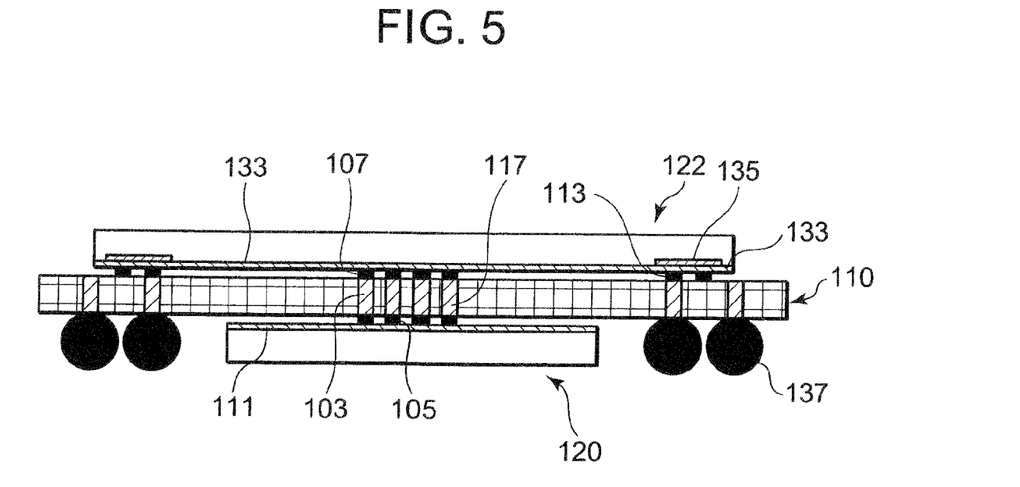
FIG. 5 is a cross-sectional view showing a configuration of a semiconductor device in Embodiment 2.

FIG. 5 is a cross-sectional view showing a configuration of a semiconductor in the present embodiment.

The basic configuration of the semiconductor shown in FIG. 5 is the same as the configuration of the semiconductor shown in FIG. 1 (Embodiment 1). The differences between the configurations of the semiconductors shown in FIGS. 1 and 5 are that the semiconductor shown in FIG. 5 is provided with the first semiconductor chip 122 having the element forming surface 133 thereof facing the silicon interposer 110, and is provided with no through electrode.

An electrode 135 provided on the element forming surface 133 of the first semiconductor chip 122 is electrically connected to the through electrode 117 in a through electrode construction 103 via a bump electrode 131.

The semiconductor device shown in FIG. 5 also has the silicon substrate 101 of the silicon interposer 110 and the through electrode 110 electrically connected to each other via the wiring 125a (not shown in FIG. 5). Therefore, the same effect as that of Embodiment 1 can be obtained by establishing a connection between the wiring 125a (not shown in FIG. 5) provided on the silicon interposer 110 and the GND wiring or the Vdd wiring of the first semiconductor chip 122 via the wiring 125b (not shown in FIG. 5).

Embodiment 3

Figure 6:
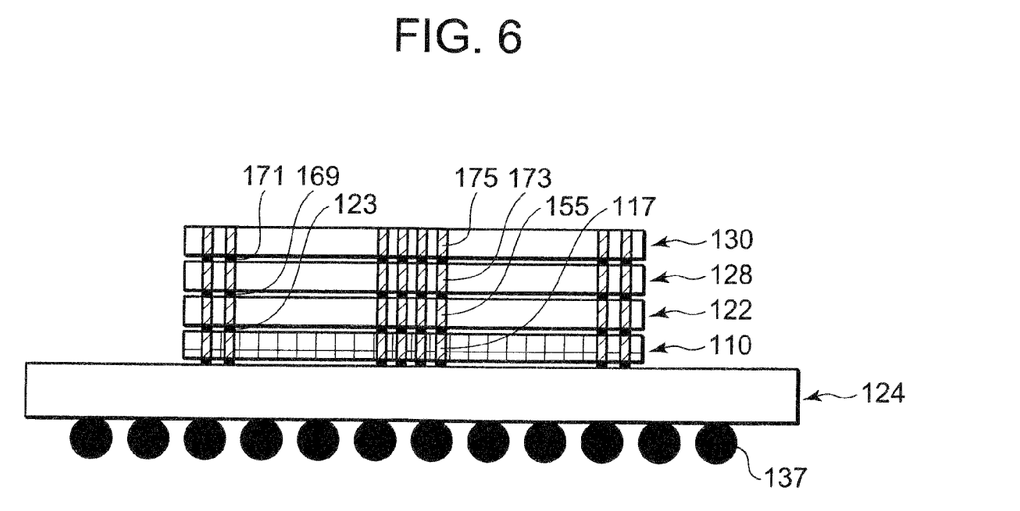
FIG. 6 is a cross-sectional view showing a configuration of a semiconductor device in Embodiment 3.

FIG. 6 is a cross-sectional view showing a construction of a semiconductor device in the present embodiment.

The basic configuration of the semiconductor device shown in FIG. 6 is the same as the configuration of the semiconductor device shown in FIG. 1 (Embodiment 1). In the configuration shown in FIG. 6, a second semiconductor chip 128 and a third semiconductor chip 130 are further stacked on the first semiconductor chip 122. The second semiconductor chip 128 and the third semiconductor chip 130 are stacked upon having the element forming surface thereof facing upward in the same manner as described for the first semiconductor chip 122 above, and are provided with a through electrode 173 and a through electrode 175, respectively. A through electrode 117 of the silicon interposer 110 is connected to a through electrode 155 of the first semiconductor chip 122 via the bump electrode 123. A through electrode 155 of the first semiconductor chip 122 is connected to a through electrode 173 of the second semiconductor chip 128 via a bump electrode 169. A through electrode 173 of the second semiconductor chip 128 is connected to a through electrode 175 of the third semiconductor chip 130 via a bump electrode 171. In FIG. 6, the silicon interposer 110 is mounted with the back surface thereof on a resin substrate 124, such as a BAG (Ball Grid Array) substrate. A bump electrode 137 is provided on the back surface of the resin substrate 124.

In such a device, which is an MCM of a CoC type having an interface with a resin substrate, the silicon substrate 101 of the silicon interposer 110 and the through electrode 117 are also connected via the wiring 125a (not shown in FIG. 6). Therefore, the same effect as that of Embodiment 1 can be obtained by establishing a connection between the wiring 125a (not shown in FIG. 6) provided on the silicon interposer 110 and the GND wiring or Vdd wiring of the first semiconductor chip 122 via the wiring 125b (not shown in FIG. 6).

Embodiment 4

Figure 8:
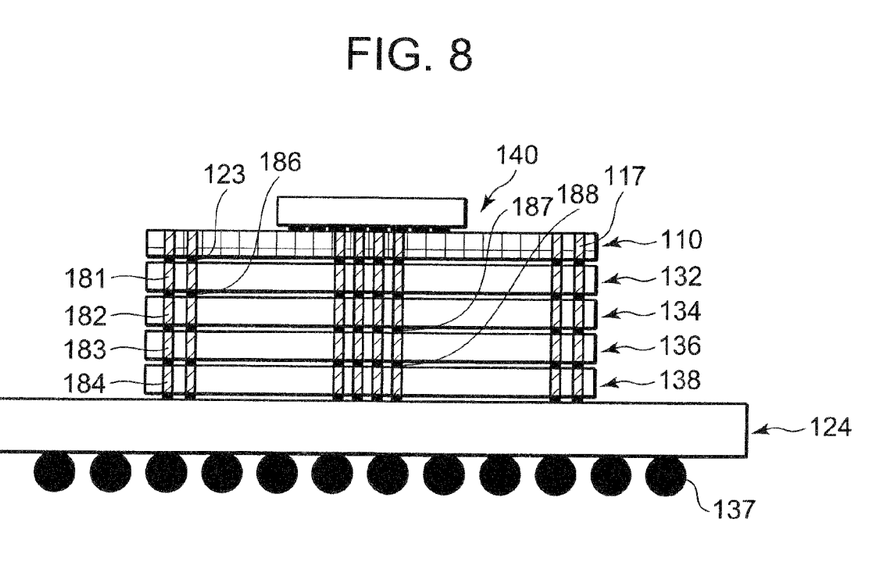
FIG. 8 is a cross-sectional view showing a configuration of a semiconductor device in Embodiment 4.

FIG. 8 is a cross-sectional view showing a construction of a semiconductor device in the present embodiment.

In the semiconductor device shown in FIG. 8, being provided between semiconductor modules, the silicon interposer 110 has a function for converting the pitch of connection between the modules. The basic configuration of the device is the same as that of the semiconductor device shown in FIG. 6 (Embodiment 3). In the configuration shown in FIG. 8, a first semiconductor chip 132, a second semiconductor chip 134, a third semiconductor chip 136, and a fourth semiconductor chip 138 are provided in order from the side of the silicon interposer 110 between the resin substrate 124 and the silicon interposer 110. The first, second, third, and fourth semiconductor chips are provided with through electrodes 181, 182, 183 and 184, respectively. Furthermore, the through electrode 117 of the silicon interposer 110 is connected to the through electrode 181 of the first semiconductor chip 132 via the bump electrode 123. The through electrode 181 of the first semiconductor chip 132 is connected to the through electrode 182 of the second semiconductor chip 134 via the bump electrode 186. The through electrode 182 of the second semiconductor chip 134 is connected to the through electrode 183 of the third semiconductor chip 136 via the bump electrode 187. The through electrode 183 of the third semiconductor chip 136 is connected to the through electrode 184 of the fourth semiconductor chip 138 via the bump electrode 188. In the configuration shown in FIG. 8, a fifth semiconductor chip 140 having no through electrode is mounted on the top surface of the silicon interposer 110 upon having the element forming surface faces the silicon interposer 110.

In the configuration shown in FIG. 8, semiconductor chips are mounted on both surfaces of the silicon interposer 110. External connection terminals provided on the silicon interposer 110 are composed of connection terminals of these semiconductor chips. Since the substrate of the silicon interposer 110, which is provided within the module, is covered with the chips on the both supper and bottom surfaces, there is no terminal provided on the substrate for establishing a direct connection with the outside.

In such a device, which is an MCM of a CoC type having an interface with a resin substrate, the silicon substrate 101 of the silicon interposer 110 and the through electrode 117 are also connected via the wiring 125a (not shown in FIG. 6). Therefore, the same effect as that of Embodiment 3 can be obtained by establishing a connection between the wiring 125a (not shown in FIG. 8) provided on the silicon interposer 110 and the GND wiring or Vdd wiring of the first semiconductor chip 132 via the wiring 125b (not shown in FIG. 8).

The silicon interposer 110 can be used not only as an alternative to a package substrate but also as a connector between chips. Accordingly, in the structure shown in FIG. 8 having no external terminal on the silicon substrate constituting the silicon interposer 110, when electric charges are accumulated, the accumulated charges have nowhere to be released. It is necessary to provide a path for releasing electric charges accumulated in the substrate. For example, by establishing a connection between the power supply or GND of the fifth semiconductor chip 140 and the silicon substrate constituting the silicon interposer 110, there would not be necessary to provide more through type wirings. Accordingly, it is possible to simplify the production process.

As described above, the semiconductor device of the present invention is especially effective when an external terminal cannot be provided to the silicon interposer. The case where an external terminal cannot be provided to a silicon interposer includes a case having a structure in which a large semiconductor chip compared to a silicon interposer is mounted, in addition to the case, shown in FIG. 8, having a structure in which multiple semiconductor chips are stacked below the silicon interposer 110.

The embodiments of the present invention have been described above with reference to drawings. These embodiments are an exemplification of the present invention. Various different structures can be employed in addition to the above described structures.

For example, the stacking styles of the MCM shown in the above embodiments are an exemplification. The number of the semiconductor chips to be stacked and a surface of the silicon interposer 110 on which a semiconductor chip is stacked are not particularly limited.

What is claimed is:
1. A semiconductor device, comprising:
an interposer made of a semiconductor;
a semiconductor chip mounted on one surface of the interposer;
a through electrode penetrating the interposer and having a side surface insulated from the interposer;
a conductive impurity diffusion layer formed on the one surface of the interposer; and
a connection conductor electrically connecting one end of the through electrode and the conductive impurity diffusion layer, wherein the conductive impurity diffusion layer is electrically connected to the interposer, and
wherein the through electrode is electrically connected to one of a power supply wiring and a GND wiring provided in the semiconductor chip.

2. The semiconductor device according to claim 1, wherein a part of the connection conductor is provided in contact with the conductive impurity diffusion layer, and the part of the connection conductor in contact with the conductive impurity diffusion layer is provided on a different conductive path other than a path connecting the through electrode to one of the power supply wiring and the GND wiring.

3. The semiconductor device according to claim 1, wherein the semiconductor chip is a first semiconductor chip, and the semiconductor device further comprises a second semiconductor chip, and
wherein the second semiconductor chip is mounted on another surface of the interposer opposite to the one surface, and an external connection terminal provided on the interposer includes a connection terminal having a connection to one of the first semiconductor chip and the second semiconductor chip.

4. The semiconductor device according to claim 1, wherein the connection conductor is connected in ohmic contact to the conductive impurity diffusion layer.

5. The semiconductor device according to claim 1, the interposer is electrically connected to one of a power source wiring and a GND wiring provided in the semiconductor chip.

6. A method for producing a semiconductor device, comprising:
preparing an interposer made of a semiconductor;
preparing a semiconductor chip provided with one of a GND wiring and a power supply wiring; and
mounting the semiconductor chip on one surface of the interposer,
wherein preparing the interposer comprises:
forming a conductive impurity diffusion layer on the one surface of the interposer, the conductive impurity diffusion layer being electrically connected to the interposer;
forming a through electrode penetrating the interposer in a predetermined position in the interposer;
forming a connection conductor for electrically connecting the through electrode and the conductive impurity diffusion layer of the interposer; and
forming a conductive member for electrically connecting the through electrode and the semiconductor chip, and
wherein mounting the semiconductor chip, comprises connecting the conductive member to one of the GND wiring and power supply wiring.

7. The method for producing a semiconductor device according to claim 6,
wherein the semiconductor chip is a first semiconductor chip, and the method further comprises mounting a second semiconductor chip on another surface of the interposer opposite to the one surface.

8. A semiconductor device comprising:
an interposer; and
a semiconductor chip mounted over the interposer and having a plurality of electrodes;
the interposer having a base and a plurality of through electrodes each penetrating the base with an electrical isolation therefrom, the base having a conductive impurity diffusion layer thereon, each of the electrodes of the semiconductor chip being electrically connected to an associated one of the through electrodes of the interposer, at least one of the through electrodes being electrically connected to the conductive impurity diffusion layer, the conductive impurity diffusion layer being electrically connected to the base, and the base of the interposer being supplied with a DC voltage when the semiconductor chip operates.

9. The device as claimed in claim 8, wherein the base of the interposer is made of a semiconductor.

10. The device as claimed in claim 9,
wherein said interposer further comprises an interconnection layer formed on the base, the interconnection layer including a plurality of connection conductors, and
wherein at least one of the through electrodes is electrically connected to the conductive impurity diffusion layer through one of the connection conductors to supply the DC voltage to the base of the interposer, and the DC voltage is one of a ground voltage and a power supply voltage.

11. The device as claimed in claim 10, wherein said interposer further having an interconnection layer formed on the base, the interconnection layer including a plurality of connection conductors each connected to an associated one of the through electrodes and a plurality of bump electrodes each formed on an associated one of the connection conductors, each of the electrodes of the semiconductor chip being connected to an associated one of the bump electrodes, and at least one of the connection conductors that is connected to the at least one of the through electrodes being in contact with the conductive impurity diffusion layer.

12. The device as claimed in claim 8,
wherein said interposer further comprises an interconnection layer formed on the base, the interconnection layer including a plurality of connection conductors, and
wherein at least one of the through electrodes is electrically connected to the conductive impurity diffusion layer through one of the connection conductors to supply the DC voltage to the base of the interposer.

13. The device as claimed in claim 12, wherein the DC voltage is one of a ground voltage and a power supply voltage.

14. The device as claimed in claim 12, wherein said interposer further having an interconnection layer formed on the base, the interconnection layer including a plurality of connection conductors each connected to an associated one of the through electrodes and a plurality of bump electrodes each formed on an associated one of the connection conductors, each of the electrodes of the semiconductor chip being connected to an associated one of the bump electrodes, and at least one of the connection conductors that is connected to the at least one of the through electrodes being in contact with the conductive impurity diffusion layer.

15. The device according to claim 8, wherein at least one of the through electrodes is connected in ohmic contact to the conductive impurity diffusion layer.

* * * * *